United States Patent
Maeda et al.

(10) Patent No.: US 6,441,477 B2
(45) Date of Patent: Aug. 27, 2002

(54) SUBSTRATE MOUNTING AN INTEGRATED CIRCUIT PACKAGE WITH A DEFORMED LEAD

(75) Inventors: Hajime Maeda; Yasunori Ikeda, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/772,891

(22) Filed: Jan. 31, 2001

(30) Foreign Application Priority Data

Jul. 24, 2000 (JP) .......................... 2000-222478

(51) Int. Cl.[7] ......................... H01L 23/495; H01L 23/48
(52) U.S. Cl. ......................... 257/696; 257/666; 257/674
(58) Field of Search .................. 257/696, 666, 257/669, 674; 438/123; 361/813

(56) References Cited

U.S. PATENT DOCUMENTS

| 5,041,901 A | * | 8/1991 | Kitano et al. ................ 257/666 |
| 5,291,375 A | * | 3/1994 | Mukai ......................... 257/696 |
| 5,367,124 A | * | 11/1994 | Hoffman et al. ............. 257/666 |
| 5,455,446 A | * | 10/1995 | Suppelsa et al. ............. 257/666 |
| 5,759,730 A | * | 6/1998 | Hermansen et al. ......... 438/106 |
| 5,880,405 A | * | 3/1999 | Nakamura et al. .......... 174/52.1 |

FOREIGN PATENT DOCUMENTS

| JP | 4-15989 | | 1/1992 | |
| JP | 5-63132 | * | 3/1993 | ................ 257/696 |
| JP | 5-343593 | * | 12/1993 | ................ 257/696 |
| JP | 6-169153 | | 6/1994 | |
| JP | 6-232317 | * | 8/1994 | ................ 257/696 |

* cited by examiner

Primary Examiner—Jasmine J B Clark
(74) Attorney, Agent, or Firm—McDermott, Will & Emery

(57) ABSTRACT

In an integrated circuit package, a deformed IC lead is reliably connected with a land for mounting. Such reliable connection between the deformed IC lead and a land is realized by a method for mounting an integrated circuit package wherein a non deformed first lead and a deformed second lead in the integrated circuit package are connected to a first land and a second land on a substrate, respectively. comprising a step for supplying a conductive material on a land wherein a larger amount of the conductive material than that of the first land is supplied to the second land; and a step for melting the conductive material supplied to connect a lead with a land wherein the conductive material molten on the first land extends in the vertical direction with respect to the substrate with a first height thereby connecting the first lead with the first land, while the conductive material molten on the second land extends with a higher second height than the first height due to surface tension thereby connecting the second lead with the second land.

5 Claims, 3 Drawing Sheets

SUBSTRATE MOUNTING AN INTEGRATED CIRCUIT PACKAGE WITH A DEFORMED LEAD

BACKGROUND OF THE INVENTION

1. Field of the Invention

The present invention relates to mounting an integrated circuit to a substrate, and in particular to connection between IC leads in an integrated circuit package and lands for mounting on a substrate.

2. Description of the Related Art

An integrated circuit package of a type which is mounted on the surface of a substrate is provided with a plurality of IC leads each being a part to be connected with the substrate. These IC leads are electrically connected reliably with a plurality of lands for mounting on the substrate by the use of a melting conductive material such as solder, in general. FIG. 1 shows solder 92-n (n: an integer) supplied on lands 32-n (n: an integer), and corresponding IC leads 12-n (n: an integer) in an integrated circuit package 10. A connecting process therefor is carried out as described hereinafter. Each solder 92-n (n: an integer) is supplied on each land 32-n (n: an integer) in accordance with a predetermined printing manner, and then each IC lead 12-n (n: an integer) is located to be rested thereat. Thereafter, the solder is melted by means of, for example, reflow soldering, whereby each IC lead 12-n is electrically connected to each land 32-n (n: an integer). When the integrated circuit package 10 is connected to the substrate 30, the integrated circuit package 10 can send and receive signals to and from other components of the substrate 30 through each leader line wiring 34-n (n: an integer).

There is a case where IC lead in the integrated circuit package 10 is deformed in handling the same in a preceding stage such as a manufacturing stage for mounting the integrated circuit package 10. Particularly, it is known that an end IC lead 12-1 positioned at the end of the integrated circuit package 10 is easily deformed. FIG. 1 shows the end IC lead 12-1 which has been deformed. The term "deformation" means herein a case where, for instance, a part of the IC lead is bent upwards, so that there is no predetermined twodimensional contact with respect to a substrate.

Heretofore, since an amount of each solder 92-n (n: an integer) to be supplied to each land 32-n (n: an integer) is equal, complete soldering could not have been performed between the end IC lead 12-1 and an land 32-1. FIG. 2 shows a state where the end IC lead 12-1 is connected to the land 32-1 by means of solder 92-1 wherein since the end IC lead 12-1 has been deformed upwards, either the end IC lead 12-1 is not i n contact with the solder 92-1 or only a part thereof is in contact with the solder 92-1. In this respect, FIG. 2 shows a state where the end IC lead 12-1 is in contact with the solder 92-1 in only a region A. The minuter region A brings about the higher possibility of disconnection due to some oscillation or the like. Under the circumstances, it is not concluded that soldering has been completed sufficiently. If the end IC lead 12-1 has not been essentially in contact with the solder 92-1, a purpose for soldering is never achieved. Such a resultant substrate is determined as a defective good as a result of inspection. Thus, for example as a rework, further solder is supplied manually onto the end IC lead 12-1, and then it has to be melted.

In this connection, for example, Japanese Patent Laid-Open No. 169153/1994 discloses such a technology that a more amount of solder is to be supplied to an end pad. However, this technology is the one to be applied for an end pad having a wider area than that of a usual end pad. Accordingly, when an end pad contains a wide area, a movable range of solder expands, so that a deformed end IC lead cannot be connected in a sufficiently firm condition after all.

SUMMARY OF THE INVENTION

An object of the present invention is to provide a method for connecting reliably a deformed IC lead to a land.

Another object of the present invention is to provide a substrate for mounting an integrated circuit package connected by means of the method as described above.

According to the present invention, a method for mounting an integrated circuit package on a substrate, wherein the integrated circuit package includes a first lead being non-deformed and connected to a first land for mounting on the substrate, a second lead being deformed and connected to a second land for mounting on the substrate, comprises a step of supplying conductive material on a land on the substrate wherein an amount of the conductive material larger than that of the first land is supplied to the second land; and melting the conductive material supplied to connect a leald in the integrated circuit package with the land wherein the conductive material molten on the first land extends in the vertical direction with respect to the substrate with a first height thereby connecting the first lead with the first land, while the conductive material molten on the second land extends with a second height higher than the first height due to surface tension thereby connecting the second lead with the second land. As a result, one of the above described objects of the present invention is achieved.

Preferably, the integrated circuit package includes a plurality of leads and the second lead is an end lead positioned at the end of the plurality of leads.

For example, the step for supplying the conductive material onto the second land is a step for supplying a much larger amount of the conductive material onto the second land at a position opposed to the first land.

According to the present invention, a substrate for mounting an integrated circuit package comprises an integrated circuit package provided with a first lead and a deformed second lead, the first lead being nondeformed and the second lead being deformed; the substrate provided with a first land and a second land; a conductive material on the first land, which has a first height in the vertical direction with respect to the substrate and which connects the first lead with the first land; an amount of the conductive material on the second land larger than that of the conductive material on the first land, which has a second height higher than the first height due to surface tension produced in the case where the conductive material is melted and which connects the second lead with the second land. As a result, the other of the above described objects of the present invention is achieved.

Preferably, the integrated circuit package includes a plurality of leads and the second lead is an end lead positioned at the end of the plurality of leads.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE PREFERRED EMBODIMENTS

A preferred embodiment of the present invention will be described hereinafter by referring to the accompanying drawings.

Figure 1:
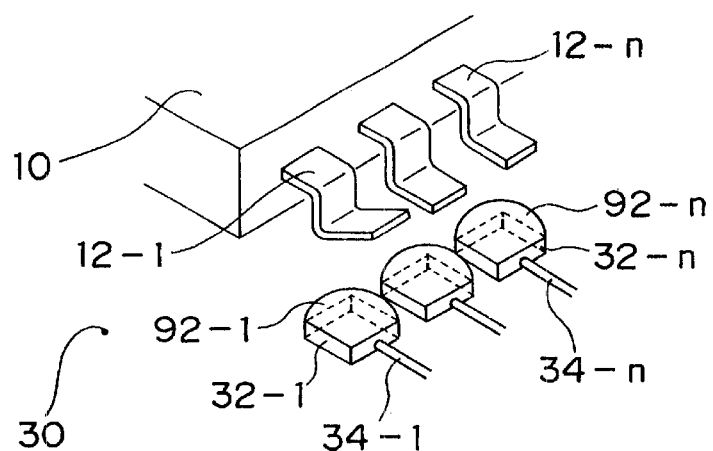
FIG. 1 is a perspective view of solder supplied on lands and corresponding IC leads in a prior art integrated circuit package.
Figure 2:
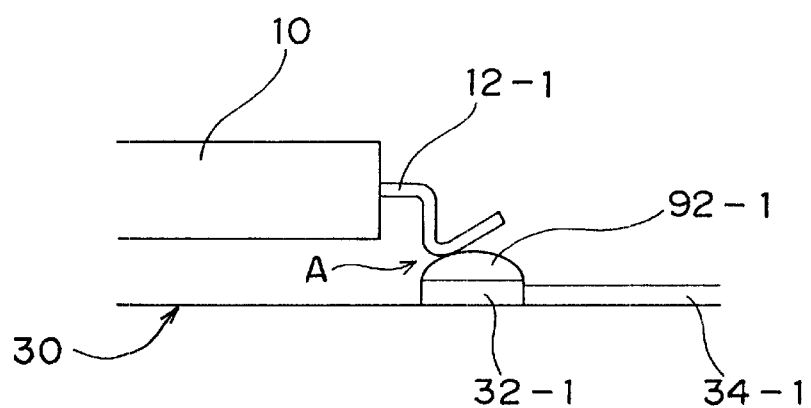
FIG. 2 is a schematic side view of a deformed IC lead to which a land is connected by means of molten solder.
Figure 3A:
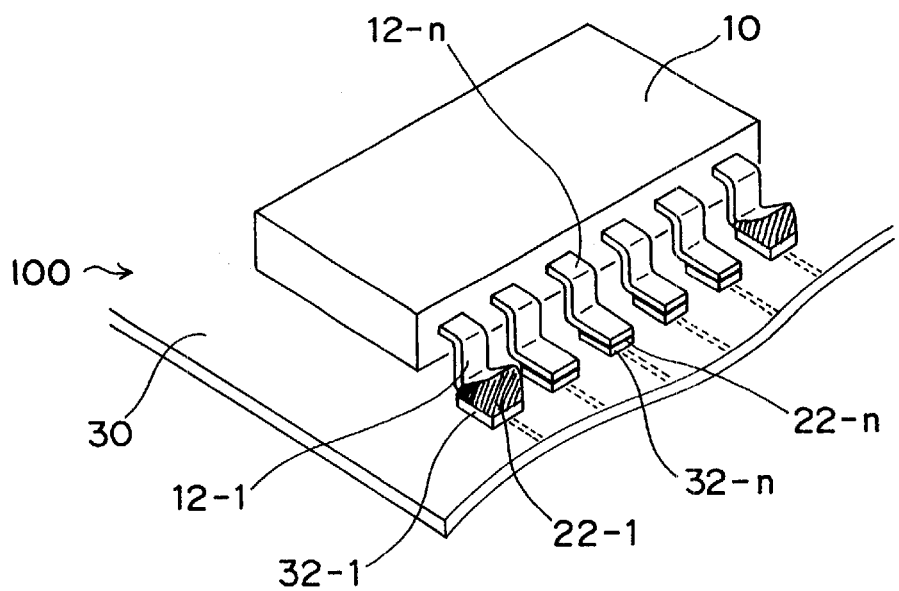
FIG. 3A is a perspective view of a substrate for mounting integrated circuit package manufactured by a method according to the present invention.
Figure 3B:
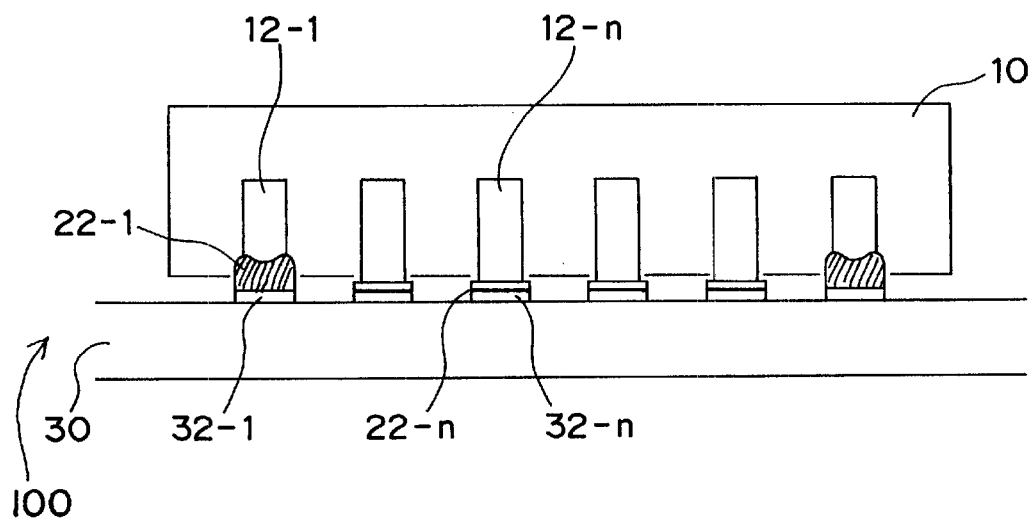
FIG. 3B is a plan view of a substrate as illustrated in FIG. 3A.

FIGS. 3A and 3B illustrate a substrate 100 for mounting an integrated circuit package manufactured by a method according to the present invention. FIG. 3A shows a perspective view of the substrate 100 which includes an integrated circuit package 10 and a substrate 30. The integrated circuit package 10 contains a plurality of IC leads 12-n (n: an integer), while the substrate 30 contains a plurality of lands 32-n (n: an integer). The substrate 100 is formed by connecting each IC lead 12-n (n: an integer) in each integrated circuit package 10 with each land 32-n (n: an integer) in the substrate 30 by means of a melting conductive material (e.g., solder) 22-n (n: an integer) which has been previously molten, and as a result, an electrically and physically firmly connected product is obtained. The expression "electrically and physically firm connection of an IC lead and a land with a conductive material" is simply expressed as "connection" hereinafter.

It is to be noted that while the land 32-n (n: an integer) is stereoscopically shown in the accompanying drawings, it is made for convenience, and the land may be in the form of a flat thin metal foil.

In the substrate 100, the IC lead 12-1 positioned at the end of the integrated circuit package 10 is a lead which is specified as the deformed one. The term "deformed" means that, for instance, a part of the IC lead is bent upwards and has no flat contact with respect to the substrate 30 for ensuring a predetermined degree of reliable connection. Further, the term "nondeformed" means that, for instance, the IC lead has flat contact with respect to the substrate 30 for ensuring a predetermined degree of reliable connection.

FIG. 3B shows the substrate 100 containing deformed and nondeformed IC leads 12-n (n: an integer) viewed from the front of the drawing. As shown in the same figure, an amount of solder 22-1 on an land 32-1 is larger than that of solder 22-n (n: an integer) on a non-end land 32-n (n: an integer) in the substrate 100, wherein a non-end land 32-n (n: an integer) is a land which is not positioned at the end of the integrated circuit package 10 and corresponds to a nondeformed IC lead. The reason therefor resides in that, in case of melting the solder 22-1, the solder 22-1 expands higher than a height of the solder 22-n (n: an integer) on the non-end land 32-n (n: an integer) in the vertical direction with respect to the substrate 30 due to surface tension, whereby the IC lead 12-1 deformed upwards is reliably connected by the solder 22-1. In FIGS. 3A and 3B, the end IC lead 12-1 as well as the one located in the same row at the other end of the integrated circuit package 10 are illustrated as the leads which have been deformed. In this respect, however, the number and the location of leads are not limited to the case shown in the FIGS. 3A and 3B.

Figure 4:
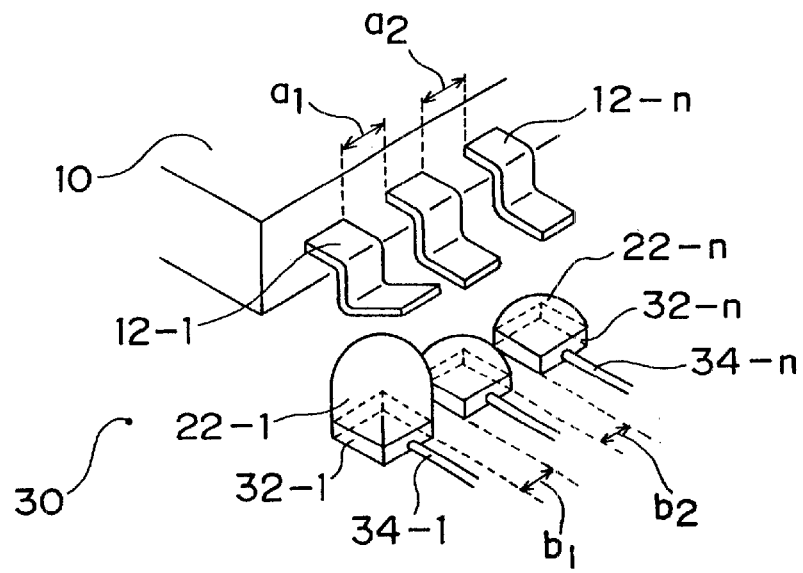
FIG. 4 is a schematic view of portions of solder supplied on lands and corresponding IC leads in an integrated circuit package.
Figure 5:
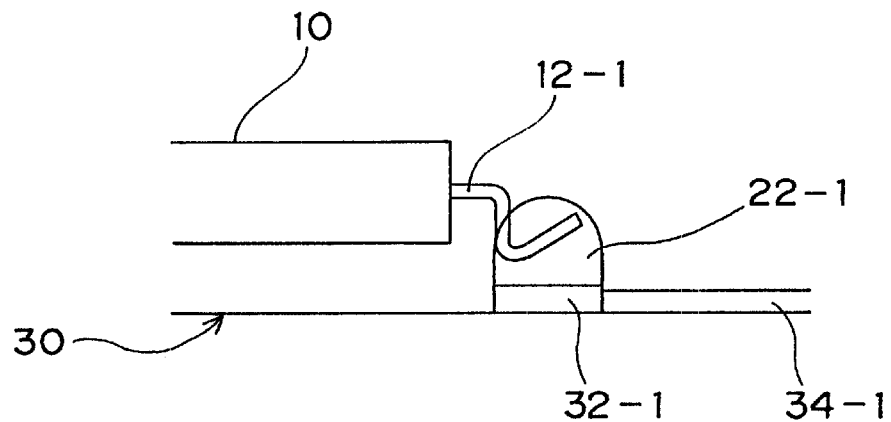
FIG. 5 is a schematic side view of a deformed IC lead to which a land is connected by means of molten solder.

A procedure for connecting the IC leads 12-n (n: an integer) containing the deformed IC lead 12-1 to the lands 32-n (n: an integer) in the substrate 30 is classified generally into two processes, i.e., a solder supplying process (FIG. 4) and a solder melting process (FIG. 5). In the following, these processes will be described in the order thereof.

FIG. 4 shows the solder 22-n (n: an integer) supplied on the lands 32-n (n: an integer) as well as the corresponding IC leads 12-n (n: an integer) in the integrated circuit package 10, respectively. As shown in FIG. 4 and as described above by referring to FIG. 3B, an amount of the solder 22-1 is larger than those of the solder 22-n (n: an integer).

Adjustment for locations and an amount of solder to be supplied can be realized by applying a solder printing technology, wherein a thin sheet (not shown) provided with apertures at desired positions and with desired dimensions is utilized. More specifically, a position of the thin sheet is adjusted in such that apertures defined on the thin sheet are fit in the lands 32-n (n: an integer) to which solder is supplied, respectively, then solder in paste form is spread over the thin sheet, and the solder is smoothed pressingly by the use of a pallet and the like. As a result, the solder is pushed out from the apertures, so that the solder is supplied on the lands 32-n (n: an integer), respectively. Accordingly, when dimension and position in respective apertures are adjusted, a desired amount of solder can be supplied to a land located at an arbitrary position. As described above, each amount of solder 22-n (n: an integer) is adjusted as shown in FIG. 4.

After the solder 22-n (n: an integer) are supplied on the lands 32-n (n: an integer), then the IC leads 12-n (n: an integer) are located to rest them on the lands 32-n (n: an integer) on which solder 22-n (n: an integer) have been supplied. Thereafter, these portions of solder are melted in accordance with, for example, a reflow soldering process. FIG. 5 shows the deformed IC lead 12-1 connected to the end land 32-1 by means of the molten solder 22-1.

As mentioned above, since a comparatively large amount of the solder 22-1 is supplied to the land 32-1, when these members are heat-treated in accordance with the reflow soldering process, the solder portion 22-1 melts on the land 32-1. The molten solder 22-1 becomes a state where it maintains a predetermined height from the substrate 30 in the vertical direction without flowing out from the land 32-1 due to its surface tension, whereby the molten solder is in contact with the IC lead 12-1 in a sufficient area for connecting these members with each other. A height of the solder portion in this case is higher than that of each solder portion molten in the non-end lands 32-n (n: an integer). When solder 22-1 is cooled, it solidifies in a condition where it extends comparatively high in the vertical direction with respect to the substrate. As a result, the IC leads 12-n (n: an integer) (FIG. 4) are connected reliably electrically and physically with the lands 32-n (n: an integer) (FIG. 4).

It is to be noted that the term "reliably physical contact" herein may contain, for example, the case where solder 22-1 is in contact with the deformed IC lead 12-1 in such a degree wherein solder 22-1 covers not only the whole lower surface of the IC lead 12-1, but also the whole upper surface thereof. Referring again to FIG. 4, usual soldering treatment is carried out also between each of non-end IC leads 12-n (n: an integer) and each of non-end lands 32-n (n: an integer), hence they are connected with each other. As a result of soldering as described above, when the integrated circuit package 10 is connected with the substrate 30, the integrated circuit package 10 can send and receive signals to and from other components of the substrate 30 through each leader line wiring 34-n (n: an integer).

As mentioned above, a procedure for supplying and melting the solder has been explained. As to a location where solder is to be supplied, it is adjusted in response to a spacing defined between the respective IC leads 12-n (n: an integer) as described hereinafter. Namely, a spacing defined between the IC lead 12-1 and its adjacent IC lead (12-2) is represented by $a_1$, while a spacing defined between an IC lead 12-n and another IC lead 12-(n+1) is represented by $a_2$. In this condition, when the spacings $a_1$ and $a_2$ are comparatively wide (for example, each of them is 1 mm), there is no particular relationship to be satisfied between spacings $b_1$ and $b_2$ wherein solder are supplied to lands with these spacings, respectively. For example, they may be $b_1 < b_2$.

On the other hand, the spacing $a_1$ and the spacing $a_2$ are comparatively narrow (e.g., 0.3 to 0.4 mm), it is preferred that the spacings $b_1$ and $b_2$ wherein solder are supplied to lands with these spacings, respectively, are $b_1 = b_2$, and further $b_1 > b_2$. This is because an amount of solder supplied to the land 32-1 is made to be comparatively large in the present invention, there is a fear of producing a solder bridge by which adjacent IC leads are electrically connected with each other.

In the case when finely arranged IC leads 12-n (n: an integer) are soldered, for instance, a larger amount of the solder may be supplied on the land 32-1 at a position opposed to its adjacent land 32-2. Thus, a possibility of producing solder bridge can be suppressed in low level at the time when solder printing was completed. Moreover, a possibility of producing solder bridge is suppressed also in low level, even after the solder was melted in accordance with reflow soldering process. The reason therefor is as follows.

In the case where, for example, the IC lead 12-1 has been deformed upwards, a larger amount of the solder 22-1 is required in comparison with solder 22-n (n: an integer), because a gap defined between IC lead 12-1 and the land 32-1 is larger than that defined between IC lead 12-n and the land 32-n. Accordingly, even if a large amount of the solder 22-1 is supplied, it is utilized for filling up the gap defined between the whole lower surface of the end IC lead 12-1 and the land 32-1 to connect them with each other, and hence, such large amount of the solder 22-1 is not an excessive amount sufficient for producing a solder bridge. An amount of the solder 22-1 may be suitably selected dependent upon a degree of deformation in an IC lead and a range within which a solder bridge is not produced after melting the solder.

As a countermeasure for producing no solder bridge, a minute wall for preventing solder from going into a gap between lands may be provided. Such minute wall can be obtained by either applying, for example, a solder resist for repelling solder onto the surface of a land with a slightly thick thickness, or placing a s uitable insulating material in between lands. If such countermeasure as described above is applied before conducting solder printing, it is necessary for establishing a height of such minute wall to be a degree at which solder printing can be realized. This is because a thin sheet (not shown) containing apertures for printing solder lodges a minute wall(s) so that solder printing cannot be effected, if the height of minute wall is impertinent.

The preferred embodiment of the present invention has been made as described above. While the present invention has been explained in such that a deformed IC lead is an end IC lead 12-1 which is positioned at the end of the integrated circuit package 10, it is not necessarily limited to the end IC lead, but it may be any non-end IC lead.

According to the present invention, a much larger amount of solder is supplied to a land in case of soldering a deformed IC lead as compared with conventional soldering, so that solidified solder portion extended in the vertical direction with respect to its substrate with a height higher than that of the other portions of solder on the corresponding lands is obtained due to surface tension produced in the case where the solder is melted, whereby the deformed IC lead can be reliably connected to the corresponding land.

If a deformed IC lead is an end lead, the end lead can be reliably connected to a land.

When a much larger amount of a conductive material is supplied on a land which is to be connected to a deformed IC lead at a position opposed to its adjacent land, a possibility of production of a solder bridge is suppressed in low level at the time when solder was supplied and after the solder was melted in accordance with a reflow soldering process.

It will be appreciated by those of ordinary skill in the art that the present invention can be embodied in other specific forms without departing from the spirit or essential characteristics thereof.

The presently disclosed embodiment is therefore considered in all respects to be illustrated and not restrictive.

What is claimed is:

1. A method for mounting an integrated circuit package on a substrate, wherein the integrated circuit package includes a first lead being nondeformed and connected to a first land for mounting on the substrate, a second lead being deformed and connected to a second land for mounting on the substrate, comprising the steps of:

supplying conductive material on a land on the substrate wherein an amount of the conductive material larger than that of the first land is supplied to the second land; and melting the conductive material supplied to connect a lead in the integrated circuit package with the land wherein the conductive material molten on the first land extends in the vertical direction with respect to the substrate with a first height thereby connecting the first lead with the first land, while the conductive material molten on the second land extends with a second height higher than the first height due to surface tension thereby connecting the second lead with the second land.

2. A method for mounting the integrated circuit package as claimed in claim 1, wherein the integrated circuit package includes a plurality of leads and the second lead is an end lead positioned at the end of the plurality of leads.

3. A method for mounting the integrated circuit package as claimed in claim 2, wherein the s tep for supplying the conductive material onto the second land is a step for supplying a much larger amount of the conductive material onto the second land at a position opposed to the first land.

4. A substrate for mounting an integrated circuit package comprising:

an integrated circuit package provided with a first lead and a second lead, the first lead being nondeformed and the second lead being deformed;

the substrate provided with a first land and a second land for mounting, respectively;

a conductive material on the first land, which has a first height in the vertical direction with respect to the substrate and which connects the first lead with the first land;

an amount of the conductive material on the second land larger than that of the conductive material on the first land, which has a second height higher than the first height due to surface tension produced in the case where the conductive material is melted and which connects the second lead with the second land.

5. A substrate for mounting an integrated circuit package as claimed in claim 4, wherein the integrated circuit package includes a plurality of leads and the second lead is an end lead positioned at the end of the plurality of leads.

* * * * *